(12) United States Patent
De Boer

(10) Patent No.: US 6,194,868 B1
(45) Date of Patent: Feb. 27, 2001

(54) VOLTAGE INDICATOR FOR INDICATING THAT THE VOLTAGE OF A BATTERY PASSES A GIVEN VALUE

(75) Inventor: Jan R. De Boer, Drachten (NL)

(73) Assignee: U.S. Philips Corporation, New York, NY (US)

( * ) Notice: Subject to any disclaimer, the term of this patent is extended or adjusted under 35 U.S.C. 154(b) by 0 days.

(21) Appl. No.: 09/483,919

(22) Filed: Jan. 18, 2000

(30) Foreign Application Priority Data

Jan. 22, 1999 (EP) .................................................. 99200190

(51) Int. Cl.⁷ .................................................. H01M 10/46
(52) U.S. Cl. ........................................... 320/132; 320/134
(58) Field of Search ................................. 320/132, 134, 320/136, DIG. 19, DIG. 21

(56) References Cited

U.S. PATENT DOCUMENTS 5,705,913   1/1998   Takeuchi et al. ...................... 320/13
5,814,995 * 9/1998   Tasdighi .

FOREIGN PATENT DOCUMENTS

0653826 * 5/1995 (EP) .
7-318621 * 12/1995 (JP) .

OTHER PUBLICATIONS

Patent Abstracts of Japan, vol. 1996, No. 4, Apr. 30, 1996.*

* cited by examiner

*Primary Examiner*—Edward H. Tso
(74) *Attorney, Agent, or Firm*—Ernestine C. Bartlett

(57) ABSTRACT

A comparator (10) compares the voltage of a battery (2) with a switchable reference voltage (Uref1A, Uref1B, 18) and supplies a signal (IS) if the voltage of the battery passes the reference voltage. The switching point of the reference voltage is defined by means of a first resistor (32). By means of the first resistor the number of cells of the battery is set to one or two. A second resistor (6) in series with the battery enables an additional voltage to be obtained in order to correct the reference voltage for the type of battery cell used.

7 Claims, 2 Drawing Sheets

VOLTAGE INDICATOR FOR INDICATING THAT THE VOLTAGE OF A BATTERY PASSES A GIVEN VALUE

BACKGROUND OF THE INVENTION

The invention relates to a voltage indicator for supplying an indication signal to indicate that a voltage of a battery passes a given value, comprising: a battery terminal for connection to the battery, a reference voltage source for supplying a reference voltage, and a comparator for comparing the reference voltage with a voltage on the battery terminal, which comparator has a first input terminal coupled to the reference voltage source, a second input terminal coupled to the battery terminal, and an output for supplying the indication signal in response to the comparison.

SUMMARY OF THE INVENTION

Such a voltage indicator is known from U.S. Pat. No. 5,705,913, particularly FIG. 2, and is used for indicating whether a rechargeable battery is nearly empty. For this purpose, the comparator of the known voltage indicator compares a fraction of the battery voltage with a reference voltage and, when the battery voltage passes the reference voltage, the output voltage of the comparator changes to another extreme value. In the development of electrical and electronic apparatuses having rechargeable batteries, the type of rechargeable battery as well as the number of cells of the rechargeable battery is not a predetermined fact. The voltage levels at which the cells are nearly empty are not the same for various cells, such as NiCd (Nickel-Cadmium), NiMH (Nickel-Metal Hydride) and the like. Moreover, the level of this voltage changes as a result of the developments in the cell formulation. Furthermore, there are apparatuses using one, two or more rechargeable cells in series.

It is an object of the invention to provide a voltage indicator by means of which the voltage level which is indicative of a nearly-empty state of a battery having one cell or more cells in series can be adjusted with the aid of two resistors. To achieve this object, the voltage indicator of the type defined in the opening paragraph is characterized in that the voltage indicator further comprises:

- a further reference voltage source for supplying a further reference voltage;
- a first resistor;
- a second resistor connected between the battery terminal and the second input terminal of the comparator;
- a voltage-to-current converter having a first current output and a second current output for supplying a first current and a second current, respectively, which currents have current intensities which are proportional to the further reference voltage and inversely proportional to the value of the first resistor, the second current output being coupled to the second input terminal of the comparator;
- means coupled to the first current output, for supplying a switching signal in response to the first current; and
- means for switching the reference voltage from the first-mentioned reference voltage source between at least two different values in response to the switching signal.

The first resistor defines the number of cells in series, for example, one or two. For this purpose, the first current of the voltage-to-current converter is compared with a threshold value. Upon passage of the threshold value the reference voltage with which the battery voltage is compared is changed to a value which is a multiple of said reference voltage, the multiple corresponding to the number of cells of the battery. The second current of the voltage-to-current converter flows through the second resistor which is arranged in series with the second input terminal of the comparator and which is connected to the battery. Thus, a correction voltage is added to the battery voltage so as to enable the nearly-empty indication to be adapted to the cell type, which correction voltage is adjustable by the appropriate choice of the value of the second resistor. When it is assumed that the voltage indicator, particularly the reference voltage sources of this indicator, is constructed as an integrated circuit, the voltage indicator in accordance with the invention offers the possibility of defining the nearly-empty indication voltage by means of two external resistors.

If the choice is only between a battery having one cell or two cells in series the voltage indicator can be implemented by using a further comparator having first and second inputs coupled respectively to the first current output and to bias voltage, and an output for supplying the switching signal. Depending on the value of the first resistor the output signal of the further comparator assumes either of two values. For the one value the reference voltage is switched to a reference value corresponding to a single cell. For the other value the reference voltage is switched to the double reference value corresponding to two cells in series. It is alternatively possible to switch from the full reference voltage to half the reference voltage.

If a distinction is to be made between three or more cells in series, the first current of the voltage-to-current converter is compared with a plurality of threshold values and the reference voltage is switched between three or more values which are multiples of each other.

Switching over of the reference voltage can be effected by choosing from a plurality of reference voltages by means of a selector in response to the switching signal. Alternatively, the reference voltage can be switched over by attenuating a reference voltage by a factor of two, three or more by means of a voltage divider having a switchable voltage dividing factor.

The second resistor, which defines the correction voltage, further has the advantage that in combination with a capacitor it can serve as a smoothing filter for possible ripple voltages on the battery voltage to be measured.

The invention can be used in apparatuses having rechargeable batteries or having non-rechargeable (primary) batteries, in which it is desired to have an indication or to show that the batteries are nearly empty. The voltage indicator may activate a visual or acoustic signal which warns the user that the battery is nearly empty. The voltage indicator may also form part of a complex battery management system which controls and monitors the charging and discharging process and which, for example, inhibits further discharging of the battery when the battery is nearly empty. Examples of apparatuses of this kind are in the fields of personal care such as shavers and toothbrushes, of telecommunication such as portable phones, of computers such as laptops and organizers, and of portable audio and video equipment.

BRIEF DESCRIPTION OF THE DRAWINGS

The invention will now be described in more detail with reference to the accompanying drawings, in which.

DESCRIPTION OF THE PREFERRED EMBODIMENTS

Figure 1:
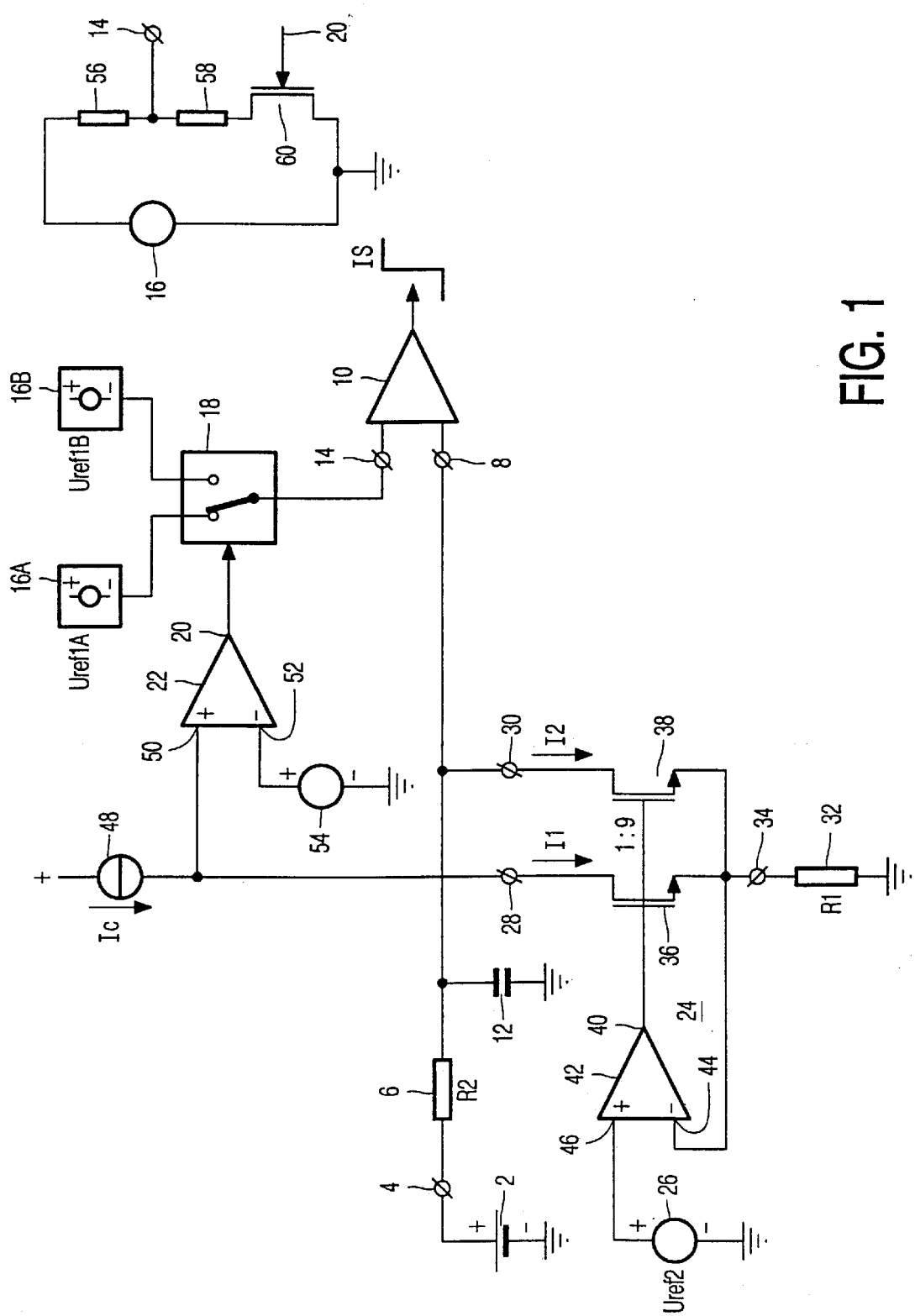
FIG. 1 shows an embodiment of a voltage indicator in accordance with the invention.

FIG. 1 shows an embodiment of a voltage indicator in accordance with the invention, which supplies an indication signal IS as an indication that the voltage of a rechargeable battery passes a given value. The rechargeable battery 2 has its positive terminal connected to a battery terminal 4, which is connected to one terminal 8 of a comparator 10 via a resistor 6 having a value R2, the indication signal IS being supplied by an output of said comparator. The battery 2 has its negative terminal connected to ground. An optional capacitor 12 is connected between the input terminal 8 and ground. The comparator 10 has its other input terminal 14 selectively coupled to one of the reference voltage sources 16A and 16B, which supply a reference voltage Uref1A and Uref1B, respectively. The reference voltage is selected by means of a selector 18 under control of a switching signal supplied by the output 20 of a further comparator 22. The voltage indicator further comprises a voltage-to-current converter 24, which converts the reference voltage Uref2 from a further reference voltage source 26 into a first current I1 and a second current I2, which are available on a first current output 28 and a second current output 30, respectively. The conversion factor of the voltage-to-current converter 24 is determined by a resistor 32 having a value R1, which resistor is connected between ground and a connection terminal 34 of the voltage-to-current converter 24. A first transistor 36 has its main current path connected between the first current output 28 and the connection terminal 34 and a second transistor 38 has its main current path connected between the second current output 30 and the connection terminal 34. By way of example unipolar (MOS) transistors are shown but it is also possible to use bipolar transistors. The control electrodes, in the present case the gates, of the transistors 36 and 38 are coupled to an output 40 of a differential amplifier 42 which has its inverting input 44 coupled to the connection terminal 34 and which has its non-inverting input 46 connected to the further reference voltage source 26. The first output 28 is coupled to a positive supply voltage via a load. The load is a current source 48 which supplies a current Ic, but a load that takes the form of a resistor is also possible. The node between the first current terminal 28 and the current source 48 is connected to one input 50 of the further comparator 22, which has its other input 52 connected to a bias voltage source 54. The dimensions (W/L) of the transistors 36 and 38 are in a ratio of 1:9 but other ratios are also possible. As a result of this, the currents I1 and I2 are also in a ratio of 1 to 9. The sum of the currents I1 and I2 flows through the resistor 32. In the case of an adequate gain of the differential amplifier 42, the voltage drop across the resistor 32 is substantially equal to the reference voltage Vref2 from the further reference voltage source 26. The current I1 is then equal to 0.1*Uref2/R1 and the current I2 is equal to 0.9*Uref2/R1. If the current I1 is larger than the current Ic or, in other terms, if the resistance value R1 of the resistor 32 is smaller than 0.1*Uref2/Ic, the sign of the voltage difference between the inputs 50 and 52 of the further comparator 22 is reversed, as a result of which the switching signal on the output 20 assumes another value. As a result of this, the reference voltage is switched from the value Uref1A of the reference voltage source 16A to the value Uref1B of the reference voltage source 16B. The value Uref1B is, for example, twice as great as the value Uref1A. Thus, the reference voltage on the input terminal 14 of the comparator 10 is changed by a factor of two. It is alternatively possible to use a single reference voltage source 16 and to attenuate its reference voltage by a factor of two by means of a voltage divider 56, 58, which is switched over by means of a switching transistor 60 under command of the switching signal.

The reference voltage on the one input terminal 14 of the comparator 10 is compared with the battery voltage on the other input terminal 8. The current I2 flows from the battery 2 to the second current terminal 30 via the resistor 6 and produces a voltage drop equal to I2*R2 across the resistor 6. This voltage drop can be used for setting the change-over point of the comparator 10 to the correct value. This change-over point is reached if the battery voltage passes a value Ubat equal to:

$$Ubat = k*Uref1A + 0.9*Uref2*(R2/R1),$$

where k is the ratio between the reference voltages Uref1B and Uref1A. By means of R1 the voltage indicator is adapted to operate in conjunction with one or two cells in series and by means of R2 the change-over point of the comparator 10 is set exactly to the correct value.

By means of the circuit shown herein it is possible to choose from two reference voltages which are in a ratio of 1:2, enabling a distinction to be made between batteries having one cell, or two cells in series. However, it is also possible to distinguish between batteries having three or more cells by comparing the current I1 with a plurality of threshold values. This requires three reference voltage sources having progressive reference voltages. Alternatively, a single reference voltage source may be used, whose reference voltage is divided by a factor of three or more when the current I1 is compared with said plurality of threshold values.

The capacitor 12 and the resistor 6 act as a filter for possible ripple voltages on the voltage of the battery 2, as a result of which the voltage indication is less susceptible to spurious signals. The reference voltage sources 16A and 16B, for example, take the form of band-gap reference sources with a voltage of once or twice 1080 mV, respectively. In combination with the voltage, nevertheless drop across the resistor 6 an indication signal IS can be obtained in the range from 1110 mV to 1180 mV within which the cell voltage of a nearly empty NiCd and NiMH battery cell lies.

The use of an accurate reference voltage in the proximity of the nearly-empty indication voltage of one, two or more battery cells and the addition of a comparatively small but less accurate voltage to said accurate voltage yet results in an overall accuracy which does not deviate much from the accuracy of the reference voltage source or sources. The less accurate voltage is the voltage across the resistor 6 and, as is apparent from the aforementioned formula, the accuracy of this voltage is determined by the tolerance of the resistance values R1 and R2, the tolerance of the ratio between the currents I1 and I2, and the tolerance of the reference voltage Uref2. External 1% resistors, an accuracy of 2.3% for the scaling factor in the dimensions of the transistors T1 and T2, and a 1% accuracy for the reference voltage Uref2 yield an accuracy of approximately 5% for the voltage across the resistor 6. A 5% accuracy for a voltage of approximately 100 mV across the resistor 6 and a 1% accuracy for a reference voltage of 1080 mV result in an overall accuracy of approximately 1.5%. Thus, with the aid of an accurate reference voltage source, the voltage indicator in accordance with the invention makes it possible to define the nearly-empty indication voltage by means of two external resistors without an excessive reduction of the overall accuracy.

Figure 2:
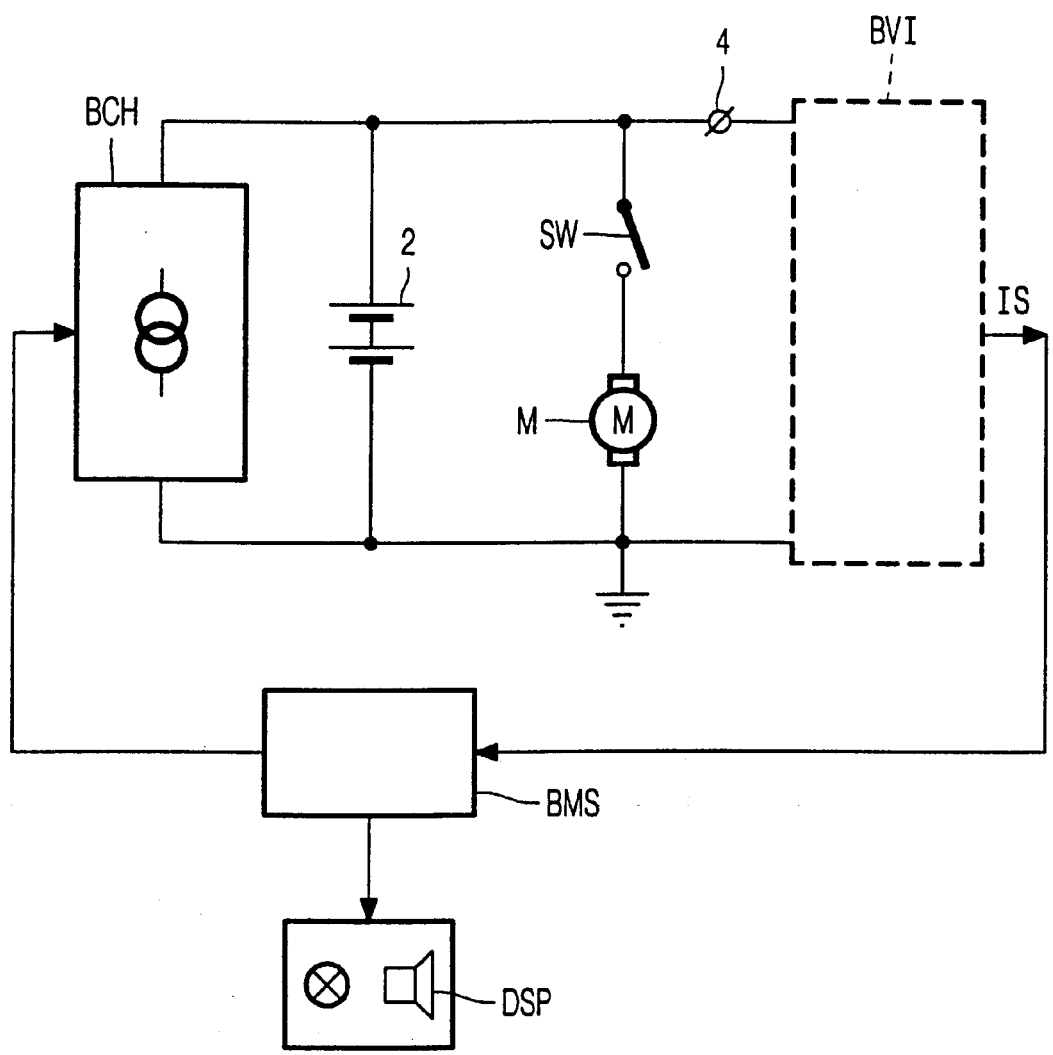
FIG. 2 shows a block diagram of a shaver having a rechargeable battery and a voltage indicator in accordance with the invention.

FIG. 2 shows an application of the voltage indicator in a shaver having a rechargeable battery. The rechargeable battery 2 of the shaver is charged by a battery charger BCH. The battery 2 powers the electric motor M which drives the shaving mechanism. The motor M can be switched on and off by means of a switch SW. The voltage indicator of FIG. 1, referenced BVI, is connected to the battery 2. The indication signal IS from the voltage indicator BVI is applied to a battery management system BMS which controls and monitors the charging and discharging process of the battery 2 and, for example, inhibits further discharging of the battery 2 when the battery is nearly empty. The battery management system BMS, inter alia, drives a display DSP which gives a visual and, if desired, also an acoustic indication that the battery 2 is nearly empty.

It will be evident that the voltage indicator can be used not only for rechargeable batteries but also for primary batteries.

What is claimed is:

1. A voltage indicator for supplying an indication signal to indicate that a voltage of a battery passes a given value, comprising: a battery terminal for connection to the battery, a first reference voltage source for supplying a reference voltage, and a comparator for comparing the reference voltage with a voltage on the battery terminal, which comparator has a first input terminal coupled to the reference voltage source, a second input terminal coupled to the battery terminal, and an output for supplying the indication signal in response to the comparison, wherein the voltage indicator further comprises:

a further reference voltage source for supplying a further reference voltage;

a first resistor; coupled to a voltage-to-current converter;

a second resistor connected between the battery terminal and the second input terminal of the comparator;

the voltage-to-current converter having a first current output and a second current output for supplying a first current and a second current, respectively, which currents have current intensities which are proportional to the further reference voltage and inversely proportional to the value of the first resistor, the second current output being coupled to the second input terminal of the comparator;

means coupled to the first current output for supplying a switching signal in response to the first current; and means for switching the reference voltage from the first reference voltage source between at least two different values in response to the switching signal.

2. A voltage indicator as claimed in claim 1, wherein the voltage-to-current converter comprises:

a connection terminal for the connection of the first resistor;

a first transistor having a control electrode and having a main current path connected between the connection terminal and the first current output;

a second transistor having a control electrode and having a main current path connected between the connection terminal and the second current output; and a differential amplifier having a non-inverting input connected to receive the further reference voltage, having an inverting input coupled to the connection terminal, and having an output connected to drive the control electrode of the first transistor and the control electrode of the second transistor.

3. A voltage indicator as claimed in claim 1, wherein the means for supplying a switching signal comprise:

a load connected to the first current output; and a further comparator having a first input connected to the first current output and having a second input connected to receive a bias voltage, and having an output for supplying the switching signal.

4. A voltage indicator as claimed in claim 1, wherein the means for switching the reference voltage of the first reference voltage source comprise: a plurality of reference voltage sources and a selector for selecting a reference voltage source from the plurality of reference voltage sources in response to the switching signal.

5. A voltage indicator as claimed in claim 1, wherein the means for switching the reference voltage of the first reference voltage source comprise a voltage divider connected to the first reference voltage source for dividing the reference voltage by a voltage dividing factor which can be set in response to the switching signal.

6. A voltage indicator as claimed in claim 1, further comprising a capacitor connected to the second input terminal of the comparator.

7. An electric shaver comprising: a rechargeable battery, an electric motor, a switch for connecting the motor to the battery, and a voltage indicator as claimed in claim 1, for driving an indication means for indicating a predetermined charging state of the battery.

* * * * *